United States Patent [19]
Fujino et al.

[11] Patent Number: 5,223,450
[45] Date of Patent: Jun. 29, 1993

[54] METHOD OF PRODUCING SEMICONDUCTOR SUBSTRATE HAVING DIELECTRIC SEPARATION REGION

[75] Inventors: Seiji Fujino, Toyota; Masaki Matsui, Nagoya; Mitsutaka Katada, Kariya; Kazuhiro Tsuruta, Ohbu, all of Japan

[73] Assignee: Nippon Soken, Inc., Nishio, Japan

[21] Appl. No.: 678,082

[22] Filed: Apr. 1, 1991

[30] Foreign Application Priority Data

Mar. 30, 1990 [JP] Japan ................. 2-85257

[51] Int. Cl.$^5$ ............. H01L 21/302; H01L 21/304; H01L 21/306; H01L 21/76
[52] U.S. Cl. ....................... 437/62; 437/67; 437/247; 437/927; 437/981; 148/DIG. 50; 148/DIG. 73; 148/DIG. 116
[58] Field of Search ............ 437/62, 67, 923, 981, 437/927, 947, 247; 148/DIG. 50, DIG. 73, DIG. 116, DIG. 117, DIG. 135

[56] References Cited

U.S. PATENT DOCUMENTS

| | | |
|---|---|---|
| 4,469,568 | 9/1984 | Kato et al. ............. 148/DIG. 117 |
| 4,638,552 | 1/1987 | Shimbo et al. |
| 4,710,794 | 12/1987 | Koshino et al. |
| 4,860,081 | 8/1989 | Cogan |
| 4,908,333 | 3/1990 | Shimokawa et al. ............. 437/981 |
| 4,962,062 | 10/1990 | Uchiyama et al. ......... 148/DIG. 135 |
| 4,975,350 | 12/1990 | Fujii et al. ............. 148/DIG. 135 |

FOREIGN PATENT DOCUMENTS

| | | |
|---|---|---|
| 60-121715 | 6/1985 | Japan |
| 61-42154 | 2/1986 | Japan |
| 61-59852 | 3/1986 | Japan |
| 61-182242 | 8/1986 | Japan |
| 61-183949 | 8/1986 | Japan |
| 62-4338 | 1/1987 | Japan |
| 1-107551 | 4/1989 | Japan |
| 2-96350 | 4/1990 | Japan |

Primary Examiner—Brian E. Hearn
Assistant Examiner—Kevin M. Picardat
Attorney, Agent, or Firm—Cushman, Darby & Cushman

[57] ABSTRACT

A dielectric buried layer is formed inside substrates which are directly bonded together. Firstly, a groove or a recess, or both are formed on the principal bonding plane of one of at least two kinds of semiconductor substrates to be bonded together. Once the semiconductor substrates are bonded together, the groove and recess form a space, which is filled with dielectric. Before forming the dielectric buried layer, the invention carries out a process of removing potential damage from corners of the groove and/or recess.

20 Claims, 7 Drawing Sheets

METHOD OF PRODUCING SEMICONDUCTOR SUBSTRATE HAVING DIELECTRIC SEPARATION REGION

BACKGROUND ART

(1) Technical Field

The present invention relates to a method of producing a semiconductor substrate, and particularly to a method of selectively forming a dielectric layer buried inside substrates which have directly been bonded together with a direct bonding technique.

(2) Prior Art

A dielectric separation method for isolating elements from one another in a semiconductor integrated circuit has recently been attracting attention. There have been proposed various techniques to form a dielectric layer buried inside a substrate to separate element regions from a substrate region.

One of the proposed techniques is disclosed in Japanese Unexamined Patent Publication No. 61-42154. This technique forms a groove on a mirror-polished surface of a first semiconductor substrate. The groove is open to a peripheral end face of the substrate. At the same time, a shallow recess is formed on the first semiconductor substrate or on a mirror-polished surface of a second semiconductor substrate to be bonded to the first semiconductor substrate. The recess communicates with the groove once the first and second semiconductor substrates are bonded together. The polished surfaces of the first and second substrates are attached to each other and bonded together. The bonded substrates are exposed to an oxidizing gas to form an oxide film over the recess.

The inventors of the present invention actually produced dielectric separation substrates according to the above technique and found that, as shown in FIG. 1, a connection A between a groove 53 and a recess 52 was closed with an oxide film 56, thereby preventing an oxidizing gas from flowing into the recess 52. As a result, the inside of the recess 52 could not completely be filled with the oxide film 56. It was found after repetitive tests and consideration that, when a groove and a recess were formed on the surface of a substrate according to chemical etching, dry etching, mechanical polishing, etc., corners thus formed received collective stress and were damaged. The damaged corners oxidized quicker than other regions (other faces in the recessed space) during an oxide film burying process carried out after a substrate bonding process. In particular, corners where the groove communicated with the recess markedly showed such a tendency because they were acute and, therefore, received severe damage. In this way, a portion having a special shape such as a corner locally receives stress and, therefore, quickly oxidizes. The present invention pays particular attention to this sort of damaged portion. When a substrate is made of silicon, stress caused by processing or dry etching the substrate destroys covalent bonds of Si-Si and produces many dangling bonds (nonbonded arms) in the substrate. This occurs at corners in particular. At the corners, oxygen atoms easily penetrate the substrate to promote oxidation of the corners faster than at the other parts, thereby causing the above problem.

The "damaged parts" mentioned in the present invention mean such locations where the above-mentioned damage occurs.

DISCLOSURE OF THE INVENTION

In view of these circumstances, an object of the invention is to provide a method of producing a semiconductor substrate, which can selectively and securely form a dielectric buried layer in substrates which have directly been bonded together with a direct bonding technique.

To achieve the object, the invention provides a method of producing a semiconductor substrate having a dielectric buried layer by bonding first and second semiconductor substrates. The method comprises:
- a processing step of forming a recess of predetermined depth on a region where the dielectric buried layer is to be formed on the principal bonding plane of at least one of the first and second semiconductor substrates which is to be bonded to the other of them, and a groove on the principal bonding plane of at least one of the first and second semiconductor substrates, the groove having an opening which communicates with a space defined by the recess, as well as an opening which is open to the peripheral end face of the corresponding substrate, the depth of the groove being deeper than that of the recess;
- a bonding step of directly bonding the first and second semiconductor substrates together;
- a damage removing step to be carried out in the processing step before at least an oxidizing step to be explained later, of removing damaged parts potentially existing at least at corners where the groove communications with the recess after the first and second semiconductors are bonded together, among a plurality of corners along the recess and groove which are formed on at least one of the first and second semiconductor substrates; and
- the oxidizing step of exposing the bonded substrates to an oxidizing gas and letting the gas flow along the groove, thereby growing an oxide film over an inner wall of the recess to form the buried dielectric layer.

BEST MODE FOR CARRYING OUT THE INVENTION

Figure 1:
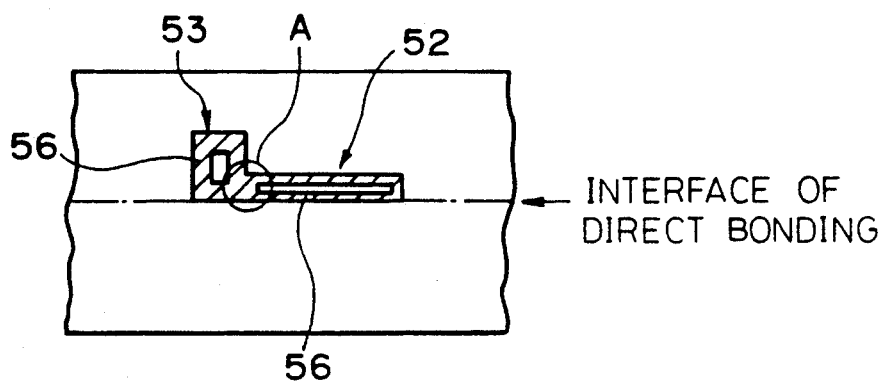
FIG. 1 is a view explaining the problems of a prior art.

Embodiments of the method of producing a semiconductor substrate according to the invention will be explained in detail with reference to the drawings.

The invention basically provides a method of producing a semiconductor substrate having a buried dielectric layer by bonding first and second semiconductor substrates together. The method comprises:

a processing step of forming, on at least one of the first and second semiconductor substrates, a recess on a region where the dielectric buried layer is to be formed after the first and second semiconductor substrates are bonded together, and a groove communicating with the recess, the groove opening to the peripheral end face of the substrate and being deeper than the recess;

a bonding step of directly bonding the first and second semiconductor substrates together; and an oxidizing step of exposing the bonded substrates to an oxidizing gas and letting the gas flow along the groove, thereby growing an oxide film in the recess to form the buried dielectric layer.

In addition, the method comprises a damage removing step to be carried out before at least the oxidizing step, of removing damaged parts from corners where the groove communicates with the recess and which are formed with the recess and groove in the processing step.

The method of producing a semiconductor substrate according to the invention will now be explained in more detail. The invention prepares first and second semiconductor substrates 1 and 5. The semiconductor substrates 1 and 5 are bonded together through their principal bonding planes facing each other.

A recess 2 of predetermined depth is formed on at least one of the first and second semiconductor substrates, for example, on a principal bonding plane 1a of the first substrate 1 at a location where a dielectric buried layer 6 is to be formed. A groove 3 is formed on the principal bonding plane of at least one of the first and second semiconductor substrates 1 and 5. The groove 3 is deeper than the recess 2 and has an opening 3b communicating with a space defined by the recess 2, as well as an opening 3c (FIG. 8) which is open to the peripheral end faces of the semiconductor substrates 1 or 5.

The recess 2 and groove 3 may be formed on any one of the first and second semiconductor substrates 1 and 5. The recess 2 may be formed on any one of the first and second semiconductor substrates 1 and 5, and the groove 3 on the other of them.

When the recess 2 and groove 3 are formed on any one of the first and second substrates 1 and 5, the recess 2 may firstly be formed and then the groove 3, or the groove 3 may firstly be formed and then the recess 2.

The recess 2 is formed to the predetermined depth on the principal bonding plane of any one of the first and second semiconductor substrates in a region where a dielectric buried layer is to be formed after the first and second semiconductor substrates are bonded together. The opening 3b of the groove 3 must be arranged in the region defined by the recess 2. When the groove 3 is formed on the semiconductor substrate on which the recess 2 is also formed, the opening 3b may directly be formed on a bottom 2a of the recess 2. When the groove 3 is formed on the semiconductor substrate 5 which is different from the semiconductor substrate 1 on which the recess 2 is formed, as shown in FIG. 2(H) the opening 3b of the groove 3 is formed on the principal bonding plane 5a of the semiconductor substrate 5 to face a space 2b defined by the recess 2.

According to the invention, the depth of the groove 3 is preferably deeper than the depth of the recess.

Figure 7A:
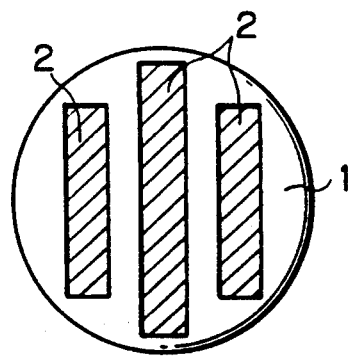
FIGS. 7(A) and 7(B) are views showing an example of arrangement of recesses according to the invention.
Figure 7B:
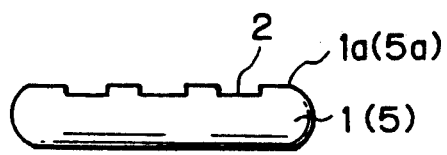

In FIGS. 7A and 7B, each recess 2 of the invention is formed in a proper region on the principal bonding plane of the semiconductor substrate 1 or 5. This region agrees with a region where the dielectric buried layer is to be formed. The recess 2 includes an oxide film forming region which will be the bottom of the dielectric separation region.

Figure 8A:
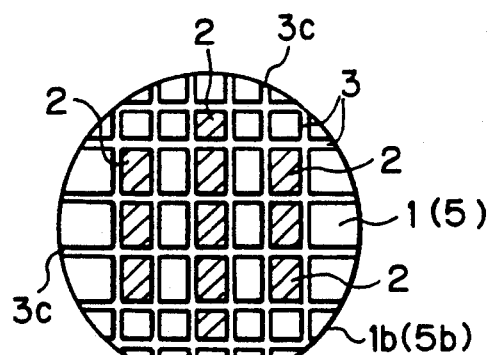
FIGS. 8(A) and 8(B) are views showing an example of arrangement of grooves and their relationship to recesses, according to the present invention.
Figure 8B:
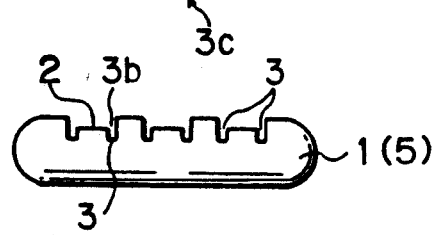

In FIGS. 8A and 8B, the groove 3 of the invention is used for oxidizing and processing a space defined by the recess 2 in a bonded substrate 10. For this purpose, the groove 3 is formed to connect the recess 2 with a peripheral end face 1b or 5b of the semiconductor substrate 1 or 5.

As shown in FIG. 8A, the groove 3 has the opening 3c which opens to the peripheral end face 1b or 5b of the semiconductor substrate 1 or 5.

In the example of FIG. 8A, the recess 2 and groove 3 are formed on one of the semiconductor substrates. The recess and groove may separately be formed on the semiconductor substrates 1 and 5, respectively. In this case also, the same idea is applicable.

Figure 9:
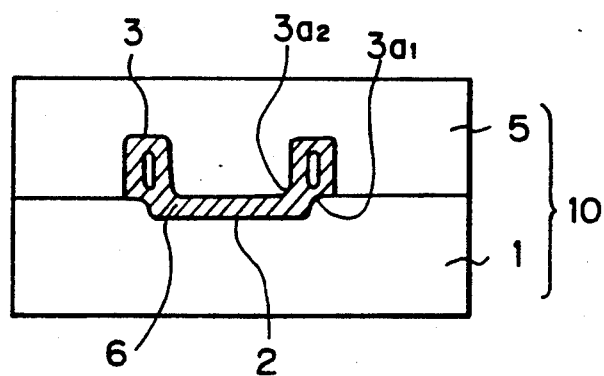
FIG. 9 is a view showing a bonded substrate 10 and its damage removing locations, the bonded substrate 10 comprising a semiconductor substrate 1 with a recess 2, and a semiconductor substrate 5 with a groove 3.

As shown in FIG. 9, damaged parts are removed from corners 3a1 and 3a2 where the groove communicates with the recess, in forming an oxide film serving as the dielectric separation layer on the recess 2.

According to the invention, a space defined by a combination of the groove 3 and recess 2 involves many corners. As explained with reference to the conventional technique, these corners are subject to a certain amount of stress so that they may quickly oxidize in an oxidizing process, thereby increasing the risk of causing the problems of FIG. 1.

Among the damaged corners, particularly those existing at locations where the groove communicates with the recess, frequently cause the above problems. It is necessary, therefore, to remove potential damaged parts from such corners.

To achieve this, the invention particularly employs a damage removing step for removing the potentially damaged parts from the corners.

The damage removing step of the invention processes semiconductor substrates to round at least corners thereof.

More precisely, the damage removing step grows a thermally oxidized film on the principal bonding plane of a semiconductor substrate on which at least a recess or a groove involving corners has been formed, and then removes the thermally oxidized film, thereby rounding the corners. Alternatively, the step may chemically etch the principal plane of a substrate on which at least a recess or a groove involving corners has been formed, thereby removing damaged parts.

According to the invention, the damage removing step may be executed after bonding first and second semiconductor substrates together.

The invention directly bonds together the first and second semiconductor substrates processed through the processing steps, into the bonded substrate 10.

The invention exposes the bonded substrate 10 to an oxidizing gas and guides the gas into the groove 3 through the openings of the groove 3 open to the peripheral faces of the semiconductor substrates. The gas is then guided along the groove into a space where the dielectric buried layer is to be formed. The gas grows an oxide film over inner walls of the recess and groove, thereby forming the dielectric buried layer 6.

Before at least the oxidizing step, the damage removing step of the invention removes damage that occurred on corners when the recess and groove were formed. Unlike the conventional method in which the damaged corners grow an oxide film more rapidly in the oxidizing process to close communicating portions between the groove and the recess, the invention can securely supply the oxidizing gas through the groove to the recess.

In this way, the method of producing a semiconductor substrate according to the invention can surely form the buried dielectric layer inside the substrates.

The embodiments of the invention will be explained. In each of the embodiments, first and second semiconductor substrates comprise monocrystalline silicon substrates.

EMBODIMENT 1

The embodiment 1 of the invention will be explained with reference to the figures.

FIGS. 2(A) to 2(G) are sectional views showing processes of producing a semiconductor substrate according to the first embodiment of the invention.

Figure 2A:
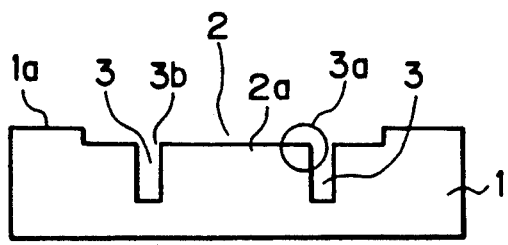
FIGS. 2(A) to 2(H) are sectional views sequentially showing processes of producing a semiconductor substrate according to a first embodiment of the invention.

In FIG. 2(A), a first semiconductor substrate 1 has a mirror-polished surface (a principal bonding plane) 1a, which is selectively etched by chemical etching or by reactive ion etching (hereinafter referred to as RIE) to form a recess 2 of 0.2 to 2 micrometers in depth.

Thereafter, a groove 3 is formed on the recess 2 along the vicinity of a boundary between the recess 2 and the mirror surface 1a, by dicing, chemical etching, or RIE. The groove 3 opens to ends of the substrate, and its width and depth are greater than the depth of the recess 2. The shape of the groove 3 is determined according to the shape of the recess 2 and the size of the substrate. This embodiment uses a five-inch wafer, forms each recess 2 into a strip of 2 mm wide and 0.42 micrometers deep, and chemically etches a grid-like groove 3 to 30 micrometers wide and 6.3 micrometers deep.

Figure 2B:
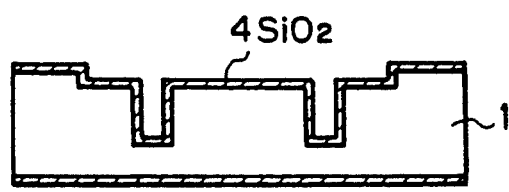
Figure 2C:
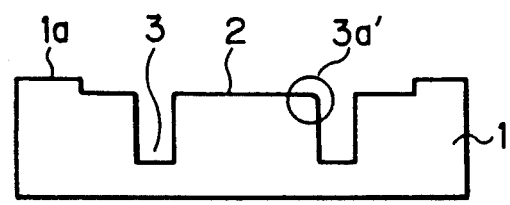

In FIG. 2(B), a heat treatment forms a thermally oxidized layer 4 of about 1 to 2 micrometers over the surface of the first semiconductor substrate 1. Thereafter, in FIG. 2(C), a hydrofluoric acid liquid completely removes the thermally oxidized layer 4. This process rounds a corner 3a defined by the recess 2 and groove 3 of FIG. 2(A) into a corner 3a' of FIG. 2(C), thereby removing damaged parts produced when the recess 2 and groove 3 were formed. The reason for this is because the heat treatment isotropically oxidizes the surface of the substrate and because the damaged parts (corners) oxidize more quickly than the other parts.

The first semiconductor substrate 1 and the second semiconductor substrate 5 whose at least one surface is mirror-polished are boiled with Trichlene, supersonically washed with acetone, and washed with a mixture of $NH_3:H_2O_2:H_2O = 1:1:4$ to remove organic substances, with a mixture of $HCl:H_2O_2:H_2O = 1:1:4$ to remove metal contamination, and with pure water. Thereafter, a mixture of $HF:H_2O = 1:50$ washes natural oxide films away from the substrates. The substrates are then soaked in an acidic solution such as a mixture of $H_2SO_4:H_2O_2 = 3:1$, or thermally oxidized, or irradiated with oxygen plasma to form oxide layers each of 10 to 30 angstroms over the surfaces of the substrates, thereby providing them with a hydrophilic property.

Figure 2D:
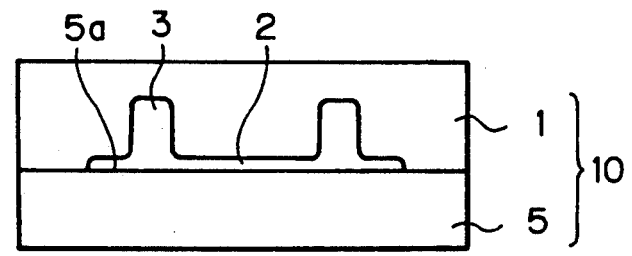

The substrates are dried with dry nitrogen, etc., to control water adsorbed on the surfaces of the substrates. The mirror surfaces 1a and 5a of the two substrates 1 and 5 are attached to each other as shown in FIG. 2(D). The two substrates 1 and 5 then bond to each other due to hydrogen coupling of silanol radicals formed over the surfaces and water molecules adsorbed on the surfaces. The bonded substrates 1 and 5 are dried in a vacuum of 10 torrs or below. To compensate for warpage of the substrates 1 and 5, a load of 30 g weight/cm² or greater may be applied to them. The substrates 1 and 5 are then heat-treated in an inert gas such as a nitrogen gas or an argon gas at 1100 degrees centigrade or over for an hour or longer. This triggers a dehydrate condensation reaction on the bonded faces to form couplings (Si-0-Si) of silicon (Si) and oxygen (0). Further, oxygen 0 diffuses inside the substrates to form couplings (Si-Si) of Si atoms, thereby directly bonding the two substrates 1 and 5 together into a bonded substrate 10. At this time, the recess 2 does not bond to the opposite side but forms a hollow space.

Figure 2E:
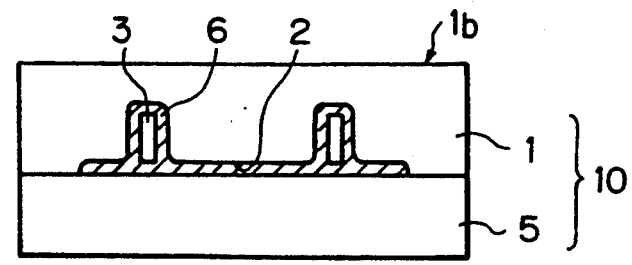

In FIG. 2(E), the bonded substrate 10 is heat-treated in an oxidizing atmosphere such as a dry $O_2$ gas, a wet $O_2$ gas, or a mixed combustive gas of $H_2/O_2$ at 900 degrees centigrade or over for an hour or longer to oxidize the surface of the hollow space inside the substrate 10 through the groove 3, thereby forming a silicon oxide layer 6. The oxidizing time of the oxidizing process of FIG. 2(E) is so set that the hollow space formed with the surface of the recess 2 and the surface 5a of the second semiconductor substrate is completely filled with thermal silicon oxide growing from both the surfaces.

These processes form the silicon oxide layer 6 serving as a buried dielectric layer inside the semiconductor substrates. The processes of FIGS. 2(B) and 2(C) round the corners which have been formed with the recess 2 and groove 3 in the process of FIG. 2(A), thereby removing damaged parts. As a result, thermal silicon oxide grows at a uniform speed in the oxidizing process of FIG. 2(E), thereby solving the problems of the conventional technique that the corners are closed to leave a space in the recess, and thereby surely forming the buried dielectric layer inside the substrates.

Figure 3A:
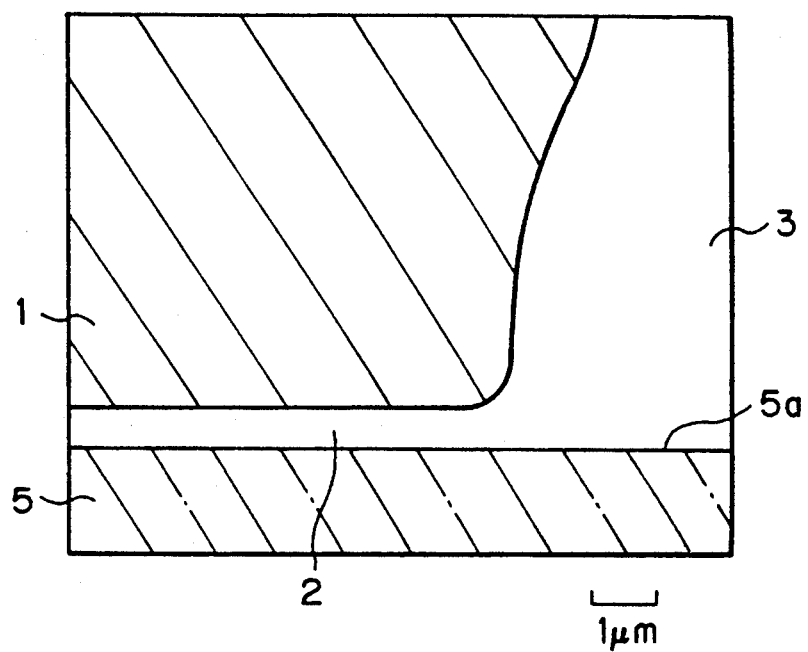
FIGS. 3(A) and 3(B) are sectional views showing corners formed with a recess 2 and a groove 3 in the processes of FIGS. 2(D) and 2(E)
Figure 3B:
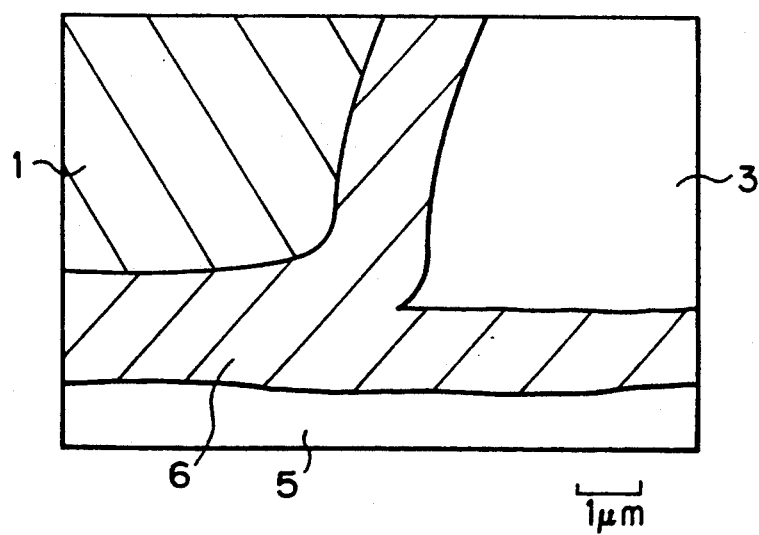

The inventors actually formed a sample, observed a section of the sample with a scanning electron microscope (SEM), and found that corners formed with the recess 2 and groove 3 were rounded (FIG. 3(A)), that thermal silicon oxide grew at a constant speed during the thermal oxidation process, and that the recess 2 was completely filled with the thermal silicon oxide 6 (FIG. 3(B)). FIGS. 3(A) and 3(B) are enlarged sections corresponding to the processes of FIGS. 2(D) and 2(E) and showing the corners formed with the recess 2 and groove 3.

Figure 2F:
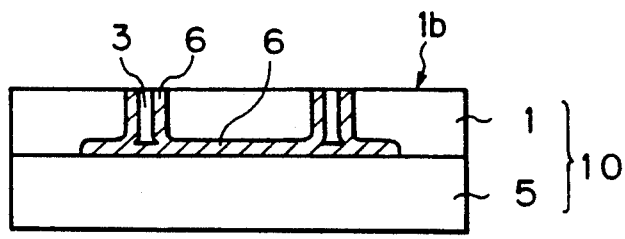

In FIG. 2(F), the surface 1b of the substrate 1 is polished or etched to open the groove 3.

Figure 2G:
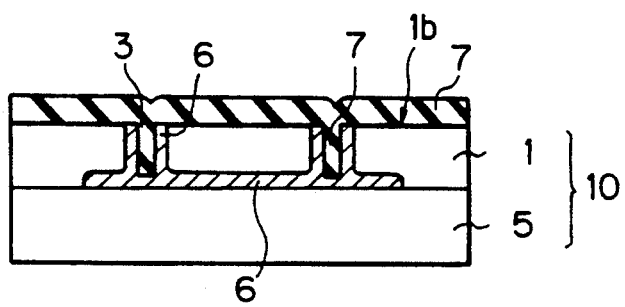
Figure 2H:
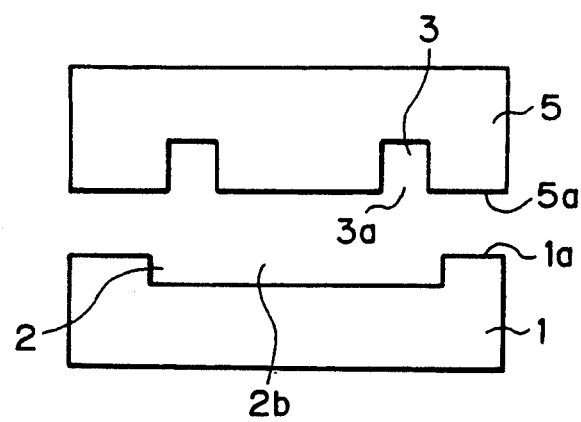

In FIG. 2(G), a CVD method is employed to deposit polycrystalline silicon 7 over the substrate to bury the groove 3.

The polycrystalline silicon 7 for filling the groove may be insulation material such as oxide and nitride, and the filling technique may be spattering, vapor deposition, SOG, etc.

It is not necessary to completely fill the groove 3 with the filling material 7 but a hollow space may remain in the groove 3, if the surface opening of the groove is closed.

The deposited material on the surface 1b is removed by polishing or by RIE to flatten the surface, thereby completing the semiconductor substrate 10 having element separation regions which are electrically completely isolated from one another with the filled material 7 and silicon oxide layer 6. Required elements are formed on the substrate 10 to prepare a required semiconductor device.

Figure 4:
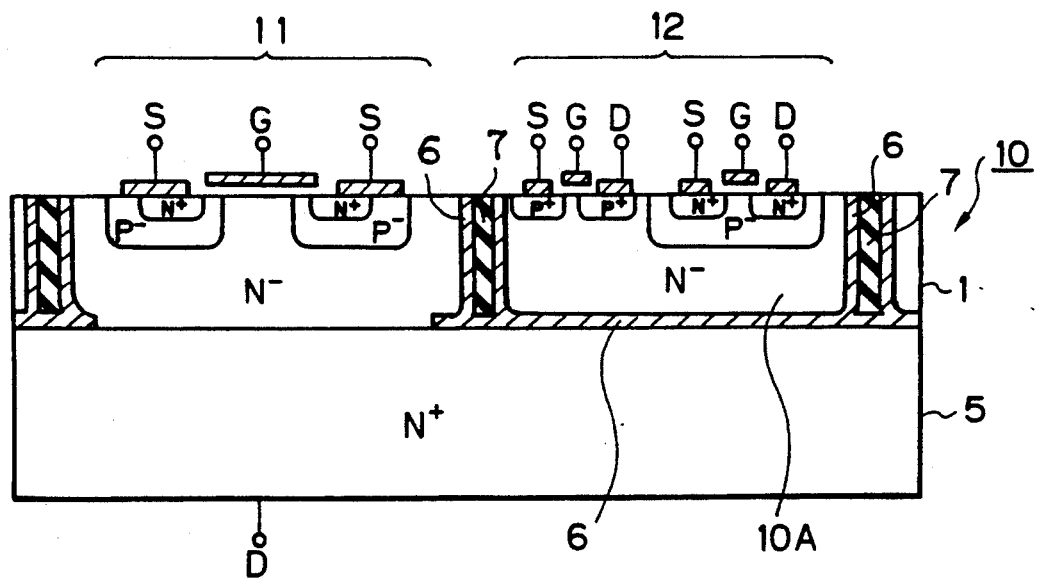
FIG. 4 is a sectional view showing a semiconductor device produced according to the first embodiment of the invention.

FIG. 4 is a sectional view showing a semiconductor device produced according to the abovementioned method with an N⁻-substrate serving as the first semiconductor substrate 1 and an N⁺substrate serving as the second semiconductor substrate 5. A vertical-type power transistor 11 and a logic circuit 12 for controlling the transistor 11 are formed on a one-chip semiconductor substrate 10. The logic circuit 12 is formed in an element separation region 10A isolated from the transistor 11 with a silicon oxide layer 6 and a filled material 7. This arrangement achieves an excellent separation withstand voltage and heat resistance.

EMBODIMENT 2

The second embodiment of the invention will be explained with reference to FIGS. 5(A) to 5(E).

Figure 5A:
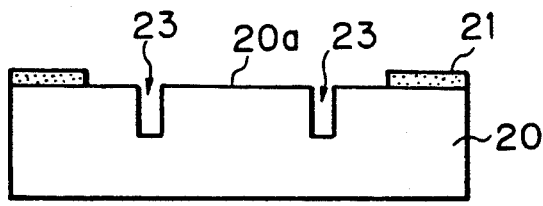
FIGS. 5(A) to 5(E) are sectional views sequentially showing processes of producing a semiconductor substrate according to a second embodiment of the invention.

Firstly in FIG. 5(A), at least one surface 20a of a first semiconductor substrate 20 is mirror-polished. A groove 23 corresponding to the groove 3 of the first embodiment is formed on the mirror surface 20a. The groove 23 is open to end faces of the substrate. A CVD method, etc., is employed to form a nitride film 21 over the surface of the substrate, and a standard photo process is employed to expose a predetermined region (where a dielectric buried layer is to be formed) including the groove 23 on the surface.

Figure 5B:
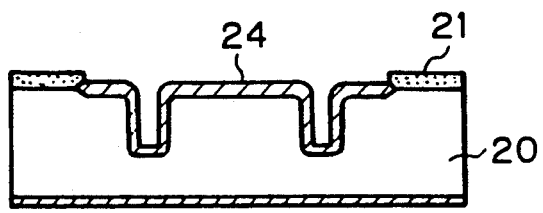

In FIG. 5(B), the exposed predetermined region is selectively oxidized to form a thermal oxide layer 24 of about 0.2 to 2 micrometers on the surface.

Figure 5C:
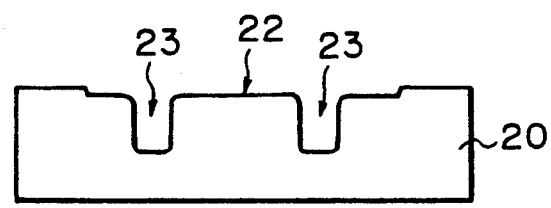

In FIG. 5(C), the nitride film 21 and thermal oxide layer 24 are completely removed.

In this way, a recess 22 corresponding to the recess 2 of the first embodiment is formed on the first semiconductor substrate 20. At the same time, damage at corners formed with the groove 23 is removed.

Figure 5D:
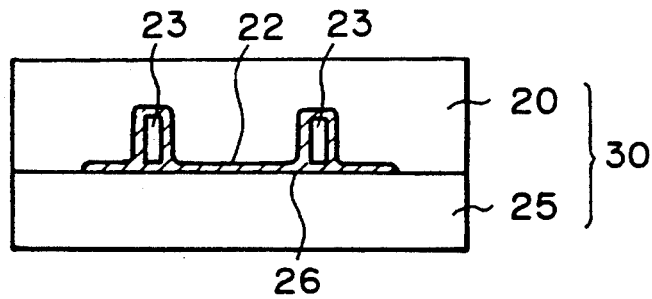

With processes similar to those of FIGS. 2(D) and 2(E), the first semiconductor substrate 20 and a second semiconductor substrate 25 are directly bonded together into an integrated substrate 30. In FIG. 5(D), the integrated substrate is heat-treated in an oxidizing atmosphere so that thermal silicon oxide may fill a hollow space formed with the surface of the recess 22 of the first semiconductor substrate and the surface of the second semiconductor substrate 25, similar to the first embodiment.

Through these processes, a silicon oxide layer 26 serving as a dielectric buried layer is formed inside the semiconductor substrates. The processes of FIGS. 5(B) and 5(C) round corners formed with the groove 23 in the process of FIG. 5(A), thereby removing damaged parts. As a result, the oxidizing process of FIG. 5(D) grows thermal silicon oxide at a uniform oxidizing speed at any location on the inner wall of the hollow space. Similar to the first embodiment and unlike the conventional technique, the corners are never closed to leave a hollow space inside the recess. Namely, the dielectric buried layer is surely formed inside the substrates.

Figure 5E:
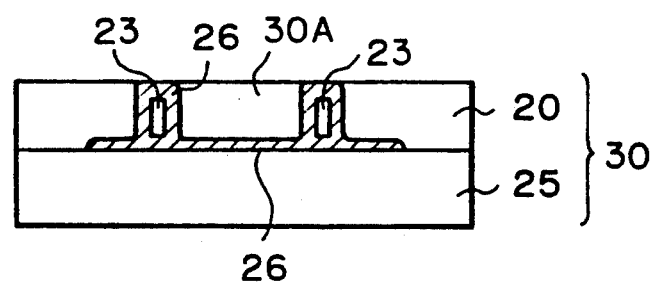

In FIG. 5(E), the surface of the bonded substrate 30 is roughly polished (lapped) until a thickness from the surface to the bonded plane reaches 30 micrometers or thinner. The surface is then selectively polished until the silicon oxide layer 26 appears from the bottom of the groove 23. This selective polishing is done with, for example, an amine liquid (piperazine) and a polyester flat pad, and with the silicon oxide layer 26 functioning as an etching stopper. As a result, an element separation region 30A surrounded by the oxide film is well controlled and formed with the above film thickness. During the process of FIG. 5(D), the inner wall of the groove 23 is covered with the oxide film, so that a hollow space left inside the groove 23 may not be required to be filled with insulation material or dielectric such as polycrystalline silicon. This simplifies the process.

To improve the oxidizing speed of the recess during the oxidizing process of FIGS. 2(E) and 5(D) in the first and second embodiments, oxidizing ions may be implanted in the recess before the bonding process.

EMBODIMENT 3

The embodiments 1 and 2 remove the oxide film 4 or 24 at first, and then bond the semiconductor substrates 1 and 5 together. The embodiment 3 bonds the semiconductor substrates 1 and 5 together at first, and then removes the oxide film, thereby removing damaged parts before an oxidizing process.

FIGS. 6(A) to 6(E) are sectional views showing processes of producing a semiconductor substrate according to the third embodiment of the invention.

Figure 6A:
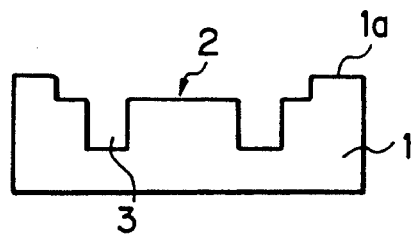
FIGS. 6(A) to 6(E) are sectional views showing processes of producing a semiconductor substrate according to a third embodiment of the invention.

In FIG. 6(A), similar to the process of FIG. 2(A) of the first embodiment, at least one surface 1a of a semiconductor substrate 1 is mirror-polished. The mirror surface 1a is partly recessed by chemical etching, RIE, or dicing to form a recess 2 and a groove 3.

Figure 6B:
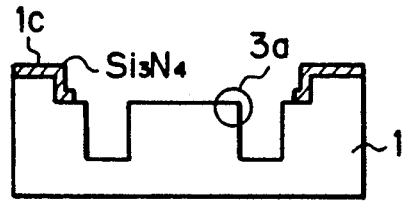

In FIG. 6(B), a silicon nitride film (Si₃N₄) 1c is formed at a region outside a dielectric separation region on the surface of the semiconductor substrate 1, by a standard CVD method and a photolithography method.

The silicon nitride film 1c serves as a mask against oxygen in thermally oxidizing the substrate 1.

Figure 6C:
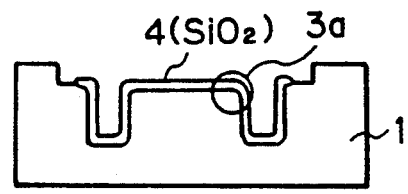

Through these processes, a thermal silicon oxide SiO₂ film 4 is formed on the surfaces of the recess 2 and groove 3 on the semiconductor substrate 1, as shown in FIG. 6(C).

At this time, a damaged part of a corner 3a is oxidized.

The thermal silicon oxide SiO₂ film 4 must not protrude from the mirror surface. To control the thickness of the film 4 in such a way, the depth of the recess 2 may be adjusted.

A proper process is carried out to remove the silicon nitride film 1c alone before a bonding process.

Figure 6D:
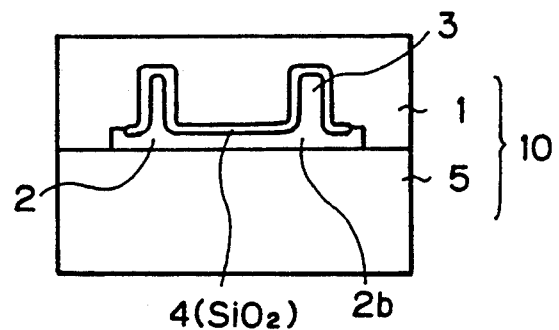

In FIG. 6(D), similar to the bonding process of FIG. 2(D) of the first embodiment, a mirror surface of a separately prepared second semiconductor substrate 5 and the mirror surface of the semiconductor substrate 1 are bonded together into a bonded substrate 10.

Through the openings of the groove 3 which are open to side end faces of the bonded substrate, a fluorine-based etchant is guided along the groove 3 toward the recess 2 to remove the silicon oxide SiO₂ film 4 existing inside the bonded substrate 10. This process removes the damaged parts and rounds the corner 3a.

Figure 6E:
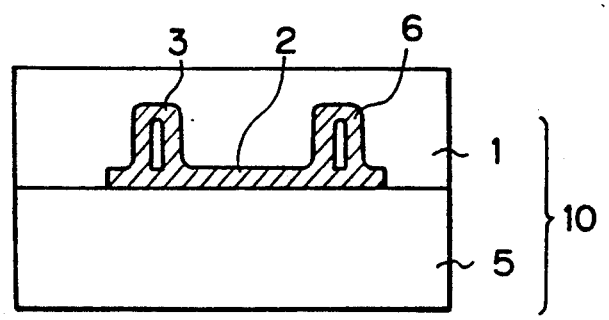

Similar to the process of FIG. 2(E) of the first embodiment, the substrate is heat-treated in an oxidizing atmosphere. Through the openings of the groove 3 which are open to the side end faces of the bonded substrate, oxygen is introduced to completely fill internal spaces of the recess 2 and groove 3 as shown in FIG. 6(E), thereby completing the bonded substrate.

In the above embodiments, the order of the processes of forming the groove and recess is not limited to the one mentioned above, if the groove and recess communicate with each other after the two substrates are bonded together. The groove and recess may be formed on any one of the semiconductor substrates, or separately formed on the substrates respectively. In either case, the invention adds the process of oxidizing the surface of the substrate on which the recess is formed and removing the oxide film thus formed, thereby rounding corners formed with the groove and recess and removing damaged parts from the corners.

In the above embodiments, the thermal oxide layer is once formed and then removed to round the corners formed with the groove and recess and remove the damaged parts. Instead, after the process of, for example, FIG. 2(A), the whole surface or a part of the surface involving the recess 2 and groove 3 of the first semiconductor substrate 1 may chemically be etched. This chemical etching is done by soaking the substrate in a mixture of hydrofluoric acid and nitric acid, or in a potassium hydroxide solution.

In executing such chemical etching, the first and second semiconductor substrates 1 and 5 may be bonded together as explained in the embodiment 3, and the etchant may be introduced through the openings of the groove 3 which are open to the side faces of the bonded substrate 10, thereby removing the damaged parts.

We claim:

1. A method of producing a semiconductor substrate having a buried dielectric layer by bonding between bonding planes of first and second semiconductor substrates, comprising:
   a processing step of forming a recess of predetermined depth on a region where the dielectric buried layer is to be formed on the bonding plane of at least one of the first and second semiconductor substrates which is to be bonded to the other of said semiconductor substrates, and a groove on the bonding plane of at least one of the first and second semiconductor substrates, the groove having an opening which communicates with a space defined by the recess, as well as an opening which is open to a peripheral end face of a corresponding substrate, a depth of the groove between a bonding plane and a bottom of the groove being deeper than a depth of the recess;
   a bonding step of directly bonding the bonding planes of the first and second semiconductor substrates together;
   a damage removing step of removing damaged parts existing at least at corners where the groove communicates with the recess after the first and second semiconductors are bonded together, among a plurality of corners along the recess and groove which are formed on at least one of the first and second substrates; and
   an oxidizing step, carried out after the damage removing step, of exposing the bonded substrates to an oxidizing gas and channelling the gas to flow along the groove, thereby growing an oxide film over an inner wall of the recess to form the buried dielectric layer.

2. A method of producing a semiconductor substrate having a dielectric separation region as set forth in claim 1, wherein the processing step forms the recess and groove on the first semiconductor substrate.

3. A method of producing a semiconductor substrate having a dielectric separation region as set forth in claim 1, wherein the processing step forms the recess on the first semiconductor substrate, and the groove on the second semiconductor substrate.

4. A method of producing a semiconductor substrate having a dielectric separation region as set forth in claim 1, wherein the damage removing step processes the semiconductor substrates to round the corners.

5. A method of producing a semiconductor substrate having a dielectric separation region as set forth in claim 2, wherein the damage removing step processes the semiconductor substrate to round the corners.

6. A method of producing a semiconductor substrate having a dielectric separation region as set forth in claim 3, wherein the damage removing step processes the semiconductor substrates to round the corners.

7. A method of producing a semiconductor substrate having a dielectric separation region as set forth in claim 1, wherein the damage removing step grows a thermally oxidized film over the principal bonding plane of the semiconductor substrate where at least the recess or the groove involving the corners is formed, and then removes the thermally oxidized film.

8. A method of producing a semiconductor substrate having a dielectric separation region as set forth in claim 2, wherein the damage removing step grows a thermally oxidized film over the principal bonding plane of the substrate where at least the recess or the groove involving the corners is formed, and then removes the thermally oxidized film.

9. A method of producing a semiconductor substrate having a dielectric separation region as set forth in claim 3, wherein the damage removing step grows a thermally oxidized film over the principal bonding plane of the substrate where at least the recess or the groove involving the corners is formed, and then removes the thermally oxidized film.

10. A method of producing a semiconductor substrate having a dielectric separation region as set forth in claim 1, wherein the damage removing step chemically etches the principal bonding plane of the substrate where at least the recess or the groove involving the corners is formed, thereby removing the damage.

11. A method of producing a semiconductor substrate having a dielectric separation region as set forth in claim 2, wherein the damage removing step chemically etches the principal bonding plane of the substrate where at least the recess or the groove involving the corners is formed, thereby removing the damage.

12. A method of producing a semiconductor substrate having a dielectric separation region as set forth in claim 3, wherein the damage removing step chemically etches the principal bonding plane of the substrate where at least the recess or the groove involving the corners is formed, thereby removing the damage.

13. A method as in claim 1 wherein a width of the recess portion is narrower than a width of the groove.

14. A method of producing a semiconductor substrate having a buried dielectric layer by bonding first and second semiconductor substrates, in accordance with claim 2, wherein a plurality of said grooves are formed to be arranged in at least two different directions to each other to thereby form a grid-like configuration of the groove in or surrounding said recess portion.

15. A method of producing a semiconductor substrate having a buried dielectric layer by bonding first and second semiconductor substrates, in accordance with claim 3, wherein a plurality of said grooves are formed to be arranged in at least two different directions to each other to thereby form a grid-like configuration of the groove in or surrounding said recess portion.

16. A method of producing a semiconductor substrate having a buried dielectric layer by bonding first and second semiconductor substrates, each having bonding planes, comprising:

a first processing step of forming a groove on the bonding plane in a region which is included in a predetermined region of the first semiconductor substrate where the buried dielectric layer is to be formed;

a second processing step of forming a recess on the predetermined region including the opening of the groove on the principal bonding plane of the first semiconductor substrate;

a bonding step of directly bonding the bonding planes of the first and second semiconductor substrates together to form a space inside the bonded substrates with the recess;

a damage removing step of growing and forming an oxide film by thermally oxidizing a region including corners which may have been damaged due to the groove formed in the processing step on the principal bonding plane of the first semiconductor substrate, and then removing the oxide film; and an oxidizing step, occurring subsequent to the damage removing step, of exposing the bonded substrates to an oxidizing gas to channel the gas to flow along the groove toward the space, thereby growing an oxide film in the space to form the buried dielectric layer.

17. A method as in claim 16 wherein a width of the recess portion is narrower than a width of the groove.

18. A method of producing a semiconductor substrate having a dielectric buried layer by bonding together bonding planes of first and second semiconductor substrates, comprising:

a first processing step of forming a groove on the bonding plane of the first substrate, the groove having an opening in a region which is covered with a predetermined region where the dielectric buried layer is to be formed;

a second processing step of forming a recess on the predetermined region on the bonding plane of the second semiconductor substrate, the predetermined region covering the opening of the groove and facing the principal bonding plane of the first semiconductor substrate on which the groove has been formed;

a bonding step of directly bonding the bonding planes of the first and second substrates together to form a space inside the bonded substrates with the recess;

a damage removing step of growing and forming an oxide film by thermally oxidizing a region including corners which may have been damaged due to the groove formed in the processing step on the principal bonding plane of the first semiconductor substrate, and then removing the oxide film; and a dielectric buried layer forming step, subsequent to said damage removing step, of exposing the bonded substrates to an oxidizing gas to channel the gas to flow along the groove toward the space, thereby growing an oxide film in the space to from the buried dielectric layer.

19. A method as in claim 18 wherein a width of the recess portion is narrower than a width of the groove.

20. A method of producing a semiconductor substrate having a buried dielectric layer by bonding bonding planes of first and second semiconductor substrates, comprising:

a first processing step of forming a groove on the principal bonding plane of the first substrate, the groove having an opening in a region which is included in a predetermined region of the first semiconductor substrate where the buried dielectric layer is to be formed;

an oxide film forming step of forming an oxide film by thermally oxidizing the predetermined region including corners of the groove formed in the bonding planes of first processing step on the bonding plane of the first semiconductor substrate;

a damage removing step of removing the oxide film to remove damaged parts from the corners as well as forming a recess communicating with the groove on the bonding plane of the first semiconductor substrate;

a bonding step of directly bonding the first and second substrates together to form a space inside the bonded substrates with the recess; and a dielectric buried layer forming step of exposing the bonded substrates to an oxidizing gas atmosphere to let the gas flow along the groove toward the space, thereby growing an oxide film in the space to form the buried dielectric layer.

* * * * *